United States Patent [19]
Contiero et al.

[11] Patent Number: 5,430,316
[45] Date of Patent: Jul. 4, 1995

[54] VDMOS TRANSISTOR WITH IMPROVED BREAKDOWN CHARACTERISTICS

[75] Inventors: Claudio Contiero, Buccinasco; Paola Galbiati, Monza; Lucia Zullino, Milan, all of Italy

[73] Assignee: SGS-Thomson Microeletronics, S.r.L., Agrata Brianza, Italy

[21] Appl. No.: 19,124

[22] Filed: Feb. 17, 1993

[30] Foreign Application Priority Data

Feb. 18, 1992 [IT] Italy .................. MI92A0344

[51] Int. Cl.[6] ......................................... H01L 29/68
[52] U.S. Cl. ...................... 257/335; 257/336; 257/339; 257/341; 257/343; 257/345; 257/402
[58] Field of Search ............... 257/335, 336, 339, 343, 257/345, 341, 402

[56] References Cited

U.S. PATENT DOCUMENTS 5,034,790  7/1991  Mukherjee .................. 257/334

FOREIGN PATENT DOCUMENTS 56-110264  1/1981  Japan .
60-249367  4/1986  Japan .
3-155167   3/1991  Japan .

OTHER PUBLICATIONS

Patent Abstracts of Japan, vol. 015, No. 387 (E–1117), JP-A-3155167 (Sanyo Electric Co. Ltd.), Sep. 30, 1991.
Patent Abstracts of Japan, vol. 005, No. 181 (E–083), JP-A-56110264 (OKI Electric Ind. Co. Ltd.), Nov. 20, 1981.
Patent Abstracts of Japan, vol. 010, No. 113 (E–399), JP-A-60249367 (Hitachi Seisakusho KK), Apr. 26, 1986.
Ishikawa, et al., "A 2.45 GHz Power LD-MOSFET with Reduced Source Inductance by V-Groove Connections", Technical Digest of the International Electron Devices Meeting, Dec. 1–4, 1985, pp. 166–169.

*Primary Examiner*—Edward Wojciechowicz
*Attorney, Agent, or Firm*—Robert Groover; Betty Formby

[57] ABSTRACT

The breakdown voltage of a VDMOS transistor is markedly increased without depressing other electrical characteristics of the device by tying the potential of a field-isolation diffusion, formed under the edge portion of a strip of field oxide separating a matrix of source cells from a drain diffusion, to the source potential of the transistor. This may be achieved by extending a body region of a peripheral source cell every given number of peripheral cells facing the strip of field-isolation structure until it intersects said field-isolation diffusion. By so connecting one peripheral source cell every given number of cells, the actual decrement of the overall channel width of the integrated transistor is negligible, thus leaving unaltered the electrical characteristics of the power transistor.

26 Claims, 6 Drawing Sheets

VDMOS TRANSISTOR WITH IMPROVED BREAKDOWN CHARACTERISTICS

CROSS-REFERENCE TO RELATED APPLICATION

This application claims priority from Italian App'n MI/92/A/000344, filed Feb. 18, 1992, which is hereby incorporated by reference.

BACKGROUND AND SUMMARY OF THE INVENTION

The present invention relates to VDMOS transistors, and particularly to VDMOS transistors integrated in so-called mixed-technology (smart-power) devices, where VDMOS transistors are fabricated together with CMOS and/or DMOS and/or bipolar transistors, etc.

In making discrete or integrated VDMOS transistors one of the main problems consists in simultaneously optimizing the breakdown voltage (which should be as high as possible) and the ON-resistance of the device (which should be as low as possible). Particularly in the case of integrated VDMOS transistors fabricated with a mixed-technology process (for integrating on the same chip also CMOS, DMOS and bipolar transistors, etc.), the output impedance of the VDMOS device assumes a more critical character than in the case of discrete VDMOS transistors, because of the additional contributions to the internal resistance that inevitably are introduced by the necessity for front-side contact. (Typically deep-drain connection diffusions are used for gathering the current at the surface of the integrated device.) FIGS. 1 and 2 show this substantial difference between a conventional discrete VDMOS structure (FIG. 1) and a conventional integrated VDMOS structure (FIG. 2).

As is well known in the art, an integrated VDMOS transistor commonly has an inter-digitated structure, as obtained by alternating finger-like matrices of source cells with finger-like drain-connection diffusions (also referred to as "sinker" diffusions) that reach down in depth as far as to intersect a buried layer, which acts as a collector of drain current. Peripheral cells of each matrix of cells, adjacent to the relative drain-connection diffusion and separated from the latter by a strip of field oxide, represent so-called edge portions. It is at the edge portions, under reverse bias conditions, that the maximum intensity of electric field is experienced. Therefore, these peripheral zones are critical as far as the breakdown voltage of the drain/source junction (body/drain) is concerned.

The optimization of the two basic parameters of a VDMOS transistor depends on the adoption of an edge configuration apt to achieve a breakdown voltage as close as possible to the theoretical breakdown voltage of a planar junction of infinite size, and from appropriately dimensioning and determining the electrical characteristics of the epitaxial layer (i.e. thickness and bulk resistivity).

A known and widely employed edge configuration for attaining an acceptably high breakdown voltage of the body/drain junction of a VDMOS structure is characterized by the presence of a biplanar field-plate structure, commonly of polycrystalline silicon, patterned to lie on the thin gate oxide layer (having a typical thickness between 50–100 nm) of the edge cells and to extend over the relatively thick, field-isolation, dielectric layer (having a typical thickness of about 1 μm), as schematically shown in FIG. 3.

This solution does not impede the operation of the peripheral cells of each source finger of the interdigitated structure of the VDMOS transistor. However, at relatively high reverse bias voltages across the body/drain junction, an intense electric field still occurs at the surface of the semiconducting monocrystalline substrate under the transition zone between the thin dielectric gate layer and the relatively thick dielectric field-isolation layer. Electric field contours are shown in FIG. 4, as obtained by computer simulation, in proximity to such a critical edge zone of an integrated VDMOS structure provided with a biplanar field-plate.

The high electric field intensity that occurs at the interface between the semiconductor and the dielectric layers may still be a cause of instability in the breakdown characteristics and makes the structure particularly sensitive to defects and accidental contamination of the dielectric layers.

Other techniques besides the use of field-plates are known for reducing the electric field magnitude in the edge zone. One of these other solutions is schematically depicted in FIG. 5. This technique contemplates the formation of a deep edge diffusion (a p+ diffusion in the example shown) that intersects and extends beyond the body diffusion (P-body). In practice, as may be easily observed in FIG. 5, the p+ diffusion profile used for making a p+, body-contact, region is also used for making this p+ edge diffusion in the peripheral cells. The increase of the radius of curvature of the diffusion profile that is so obtained along the edge region, produces a decrease (for a given voltage) of the electric field intensity in the curved region of the body/drain junction and therefore an increment of the breakdown voltage. However, this solution inhibits the formation of a secondary channel (i.e. lateral conduction through the peripheral cells facing the drain-connection diffusion), and this implies a depression of the electrical performance of the device, i.e. an increase of the internal resistance, especially in the case of an integrated VDMOS structure.

Finally it may be recalled that in the case of mixed-technology integrated circuits (e.g. in smart-power devices), for increasing the density of the cells of the integrated VDMOS structures, as well as of other components integrated in the same chip, the fabrication technology normally employs process steps derived from the so-called high-density CMOS processes. In particular:

The dielectric field-isolation layer is commonly realized by a LOCOS TM technique, rather than by etch-patterning a thick oxide layer previously grown over the whole surface.

CMOS structures commonly use field-isolation diffusions (P-field or N-field) under the edge portions of a thermally grown field oxide, for increasing the parasitic threshold voltage under the dielectric field-isolation layer, and thus more effectively isolating the CMOS transistors from each other.

Reduced junction depths are normally used, due to the need for compactness of the high-density CMOS integrated structures.

Generally, in fabricating high-density, mixed-technology devices, certain geometrical and/or technological restraints are encountered that in practice limit or exclude the possibility of implementing certain optimization techniques of the integrated structures, in particular of VDMOS structures. Notably, this is the price to pay for making the formation of technologically different structures in a single chip mutually compatible. Particularly in the case of VDMOS transistors, relatively deep, body-contact diffusions are no longer usable. Instead, a relatively shallow diffusion, which is also used for making the source and drain regions of CMOS transistors, is normally used as a body-contact region. As a consequence, the technique discussed above that contemplated the formation of a relatively deep diffusion along the edge portions of the VDMOS structure, for increasing the radius of curvature of the body/drain junction profile (e.g. P-body/n—EPI) and reducing the electric field intensity at the surface of the semiconductor in the transition zone between the gate oxide and the field oxide, is no longer applicable, unless additional masks and process steps are introduced.

The present invention provides a VDMOS transistor having a modified edge configuration capable of increasing the breakdown voltage without penalizing the internal resistance of the device. The invention is particularly useful for smart power devices.

A new method for significantly increasing the effectiveness of a biplanar field-plate without lowering the electrical performance characteristics of a VDMOS transistor is advantageously provided by the disclosed innovations. Notably, the new method of the present invention does not require the formation of a relatively deep edge diffusion, and may be implemented also for integrated VDMOS structures in high-density, mixed-technology, devices. In these applications, the method of the invention will not require the use of additional masks and process steps.

Basically, the invention may be practiced through a simple modification of a mask or of masks that are normally used in a standard fabrication process and the structural modification that is produced does not imply any substantial alteration of the electrical performance of the device, though attaining the effect of a marked increase of the breakdown voltage and of the reliability of the VDMOS structure.

These effects are obtained by establishing an electrical connection between the source region of a VDMOS transistor and a field-isolation diffusion, e.g. a P-field region, purposely formed under the edge of the thick, dielectric, field-isolation layer that border a matrix of source cells and that, in the case of an integrated VDMOS, may separate a matrix of source cells from a drain-connection (sinker) diffusion. The field-isolation diffusion may extend under the transition zone between a relatively thick field oxide layer and a relatively thin gate oxide layer present on the active area of a peripheral source cell, i.e. in the zone that is actually topped by the biplanar field-plate structure.

It has been found that by providing the VDMOS structure with such a field-isolation diffusion and by tying the potential of the field-isolation diffusion to the source potential of the device, a marked reduction of the maximum electric field intensity in the curved zone of the body/drain junction of the device (i.e. the edge zone) is achieved as well as a sensible increase of the breakdown voltage. For example, in the case of a VDMOS formed in an epitaxial layer having a thickness between 9 and 11 $\mu$m and a bulk resistivity between 1.1 and 1.6 $\Omega$-cm, the breakdown voltage may be increased from about 75 V to about 100 V.

According to a preferred embodiment of the invention, a body diffusion of a peripheral source cell every given number of peripheral cells of a matrix constituting a finger of an inter-digitated structure of an integrated VDMOS transistor is extended until it intersects a field-isolation diffusion formed under a strip of a field oxide separating the peripheral source cells from a drain diffusion. The field-isolation diffusion may extend slightly beyond the geometrical projection of the edge of the thick field-isolation dielectric layer.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

A P-body, n-channel, integrated, VDMOS structure, formed in an n-epitaxial layer, is shown in all the annexed figures. This represents by far the most common diffused form of this semiconductor device. Therefore, in the figures and in the description that follows, consequent types of conductivity are indicated for the various regions of the semiconductor that are part of the integrated structure of the VDMOS device. Of course, all the considerations which are made in relation to this predominant form are substantially valid also for an alternative (dual) form of the device, wherein all the types of conductivity and all polarities are inverted.

Figure 6:
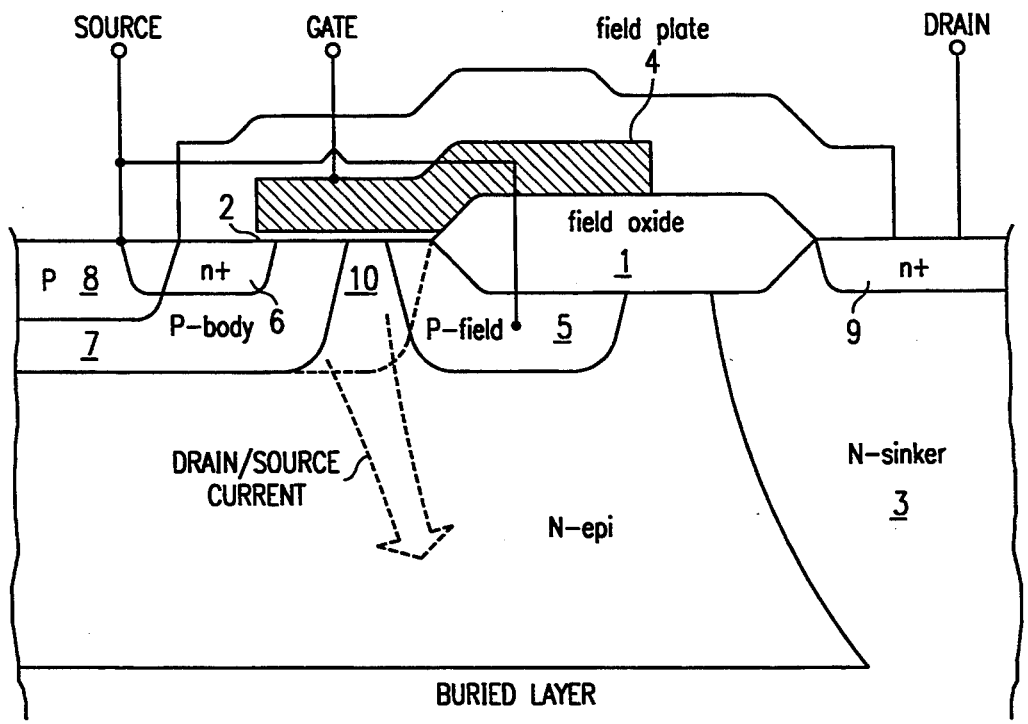
FIG. 6 schematically shows an edge zone of a VDMOS transistor, as modified according to the present invention.

The invention is schematically illustrated in FIG. 6 for the case of an integrated VDMOS transistor.

An edge zone, coinciding substantially with a transition zone between a gate oxide layer 2 present in the area of a peripheral source cell and a thick, dielectric, field-isolation, layer 1 that separates a matrix of source cells from an adjacent drain-connection diffusion 3 (N-SINKER) of an inter-digitated VDMOS structure, is customarily topped by a biplanar field-plate structure 4 of polycrystalline silicon, which operatively is at the gate potential of the VDMOS transistor. The separating strip 1 may be commonly obtained by thermally growing a thick oxide (field oxide) layer in defined areas, according to a LOGOS process.

In order to improve the breakdown characteristics of the body/drain junction, the structure, further comprises a field-isolation diffusion 5 (P-field), formed under the edge of the field oxide strip 1. This field-isolation diffusion 5 may be formed by using a technique that is normally used in CMOS structures for increasing the parasitic threshold, as referred to the thick dielectric layer represented by the field oxide 1. The N+ source region 6 of the peripheral cell, depicted in the figure, is customarily contained within a body region 7 (P-body) and a P+ body-contact region 8 normally intersects both the N+ source region 6 as well as the P-body region 7.

According to a practical embodiment, the different regions of a VDMOS structure of the invention may have the following characteristics:

| | | |
|---|---|---|
| N-EPI (dopant: P); | bulk resistivity: | 1.35 Ω-cm |
| P-body (7) (dopant: B); | sheet resistivity: | 1100 Ω/□ |
| P+ body-contact (8) (dopant: B); | sheet resistivity: | 100 Ω/□ |
| N+ source region (6) (dopant: As); | sheet resistivity: | 40 Ω/□ |
| P-field (5) (dopant: B); | sheet resistivity: | 4000 Ω/□ |

An N+ drain-contact region 9 is also shown in the figure. As schematically indicated by the arrow labelled "drain-source current", the peripheral cells of the multi-cell integrated structure of the VDMOS transistor may usefully contribute to the conduction of the drain-source current across the channel region of the peripheral cells. The field-plate structure 4 constitutes also a gate electrode of these peripheral cells.

In the schematic showing of FIG. 6, it may be seen that the profile of the body diffusion 7 (P-body) is relatively shallow, as this permits to obtain relatively short DMOS channels for improving the performance in terms of a lower internal resistance ($R_{ON}$) and of maximum current that may be driven by the power device. Moreover such a condition of relatively shallow diffusions is very often inevitable as in the case of mixed-technology integrated circuits where beside VDMOS structures also other structures (CMOS, low-leakage diodes etc.) must be integrated.

Also, in these critical design conditions of VDMOS transistors, concerning a radius of curvature of the junctions that is inevitably small because of the relative shallowness of the diffusions, the present invention allows a significant increase of the breakdown voltage of the body/drain junction, by connecting the field-isolation diffusion 5 (P-field) purposely realized underneath the edge portion of the field oxide strip 1, over which the polysilicon field-plate 4 lies, to the source region of the transistor, i.e. by tying the potential of the field-isolation region 5 to the source potential of the transistor. In FIG. 6, such an arrangement is schematically depicted by a wire connecting the source terminal (SOURCE) to the P-field region 5.

In FIG. 6, the edge of the field plate is shown approximately coincident with the edge of the diffusion 5. It is mildly preferable that these regions coincide or overlap, but this is NOT necessary to use of the disclosed inventions.

A practical embodiment of such an electrical connection is also shown in the cross-sectional view of FIG. 6 by indicating with a dashed line 10 the profile of a projection of the body region 7 (P-body) of a peripheral cell that is purposely extended until it intersects the P-field region 5 thus establishing such an electrical connection. The extension of the body region may be implemented locally in one or in a plurality of points, spaced along the edge of the integrated structure. In this way only a limited number of peripheral cells are so affected and the consequent reduction of the channel width (perimeter) of the transistor is negligible. A portion of the drain/source current of the integrated VDMOS transistor may continue to pass also through all the other peripheral cells whose body diffusion 7 is not extended laterally to intersect the field-isolation region 5.

Figure 1:
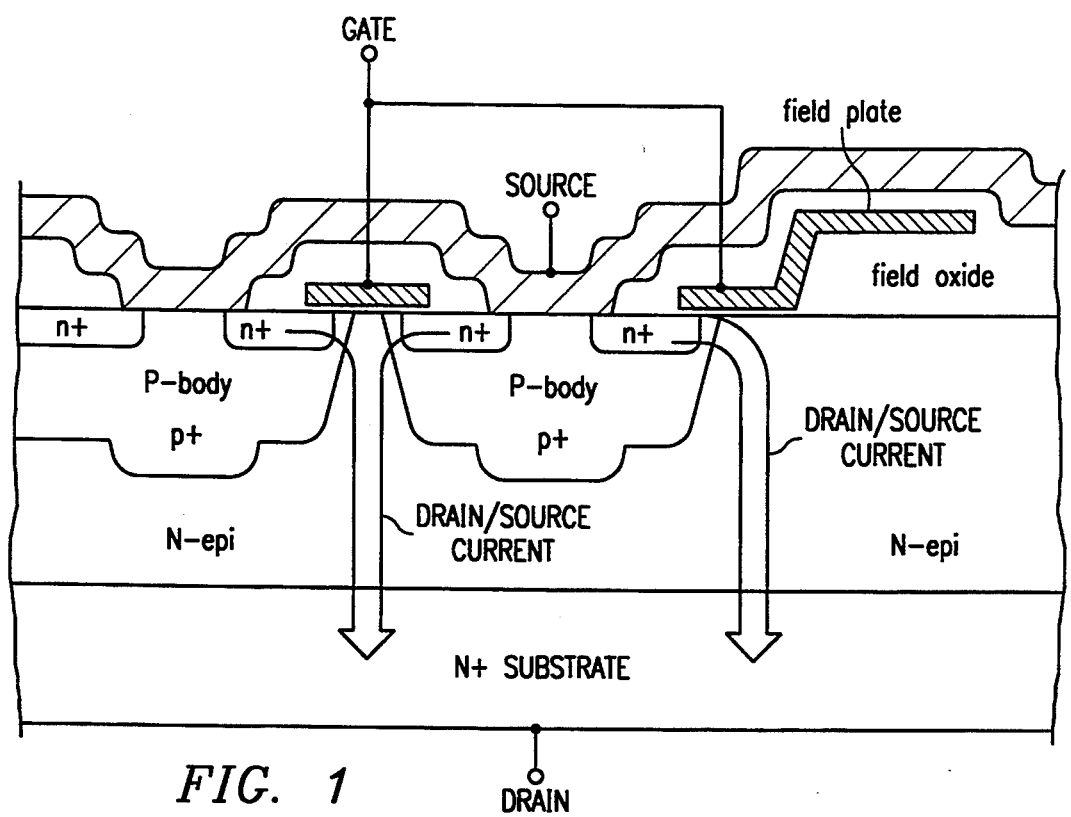
FIG. 1 is a schematic representation of a discrete type VDMOS structure, as discussed above.
Figure 2:
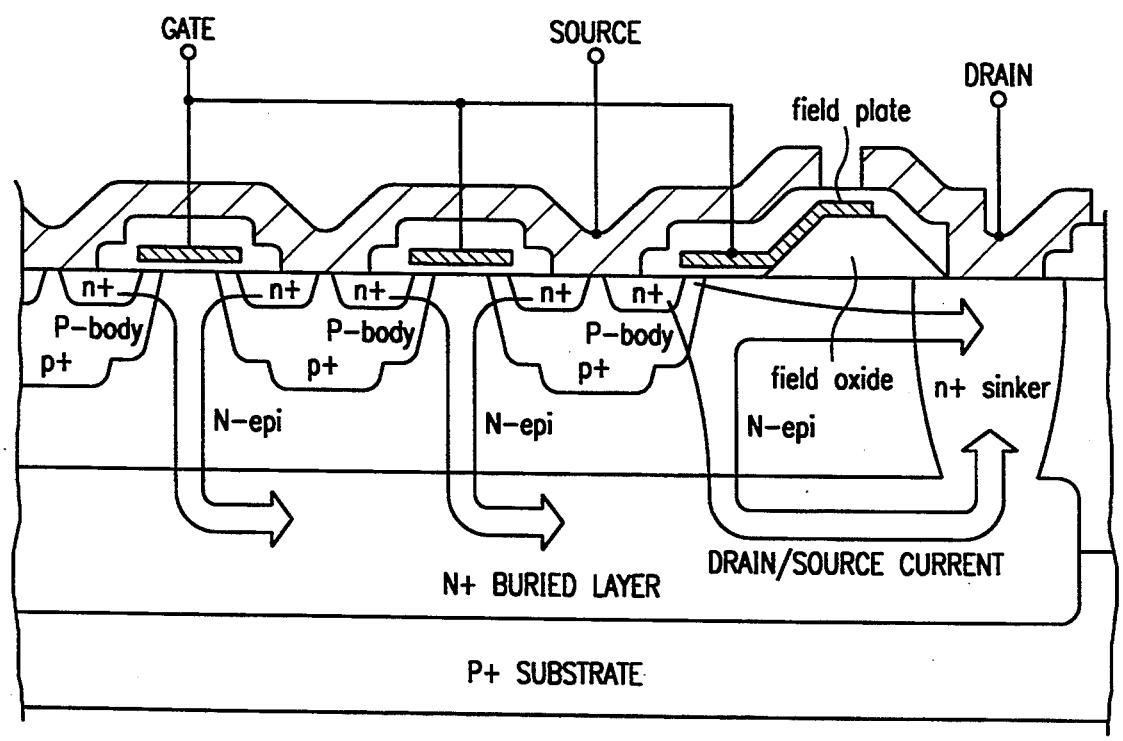
FIG. 2 is a schematic illustration of an integrated VDMOS structure, as discussed above.
Figure 3:
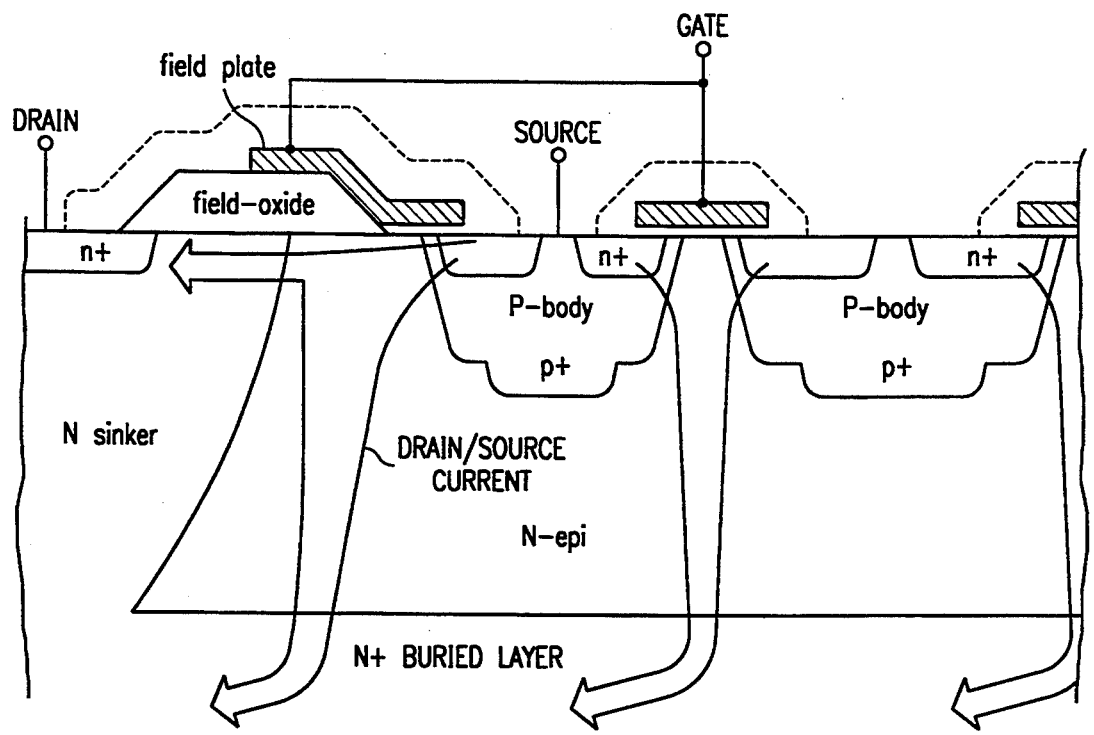
FIG. 3 is an enlarged particular of FIG. 2 that puts in evidence an edge portion of the device.
Figure 4:
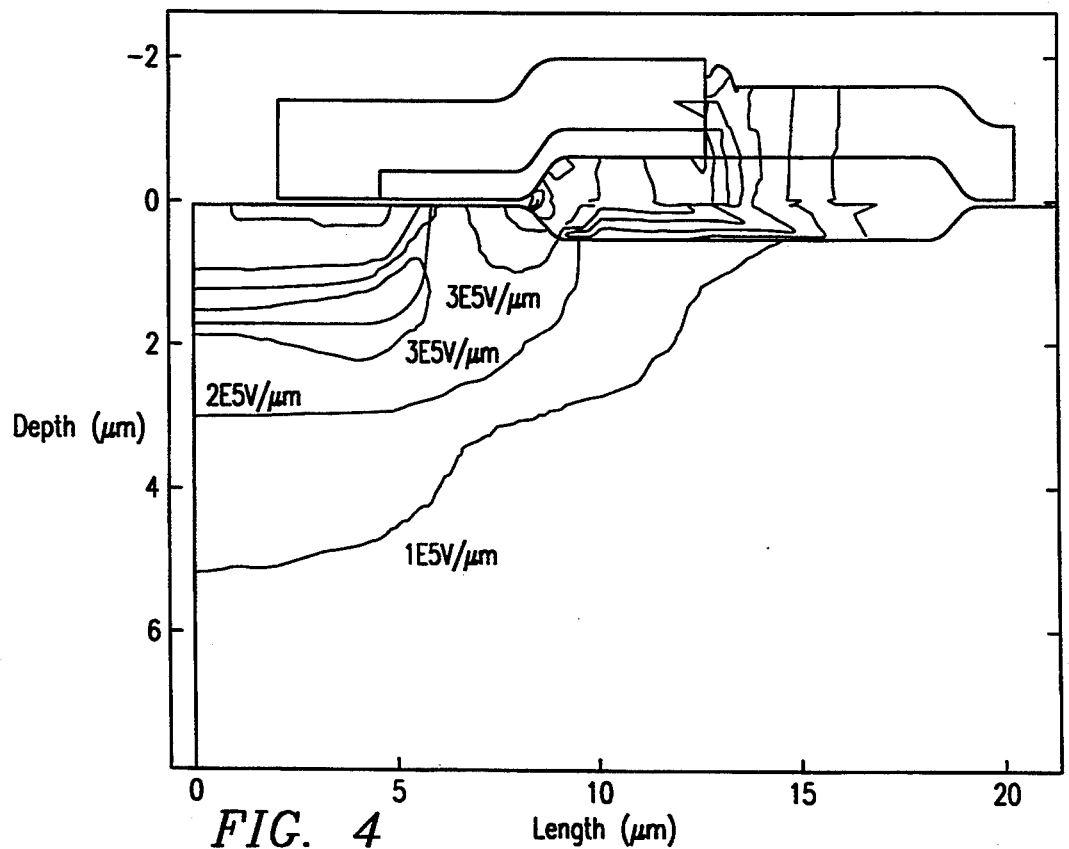
FIG. 4 is a diagram, obtained by simulation, of the contours of electric field magnitude in an edge zone of a device provided by a biplanar field-plate according to the prior art.
Figure 5:
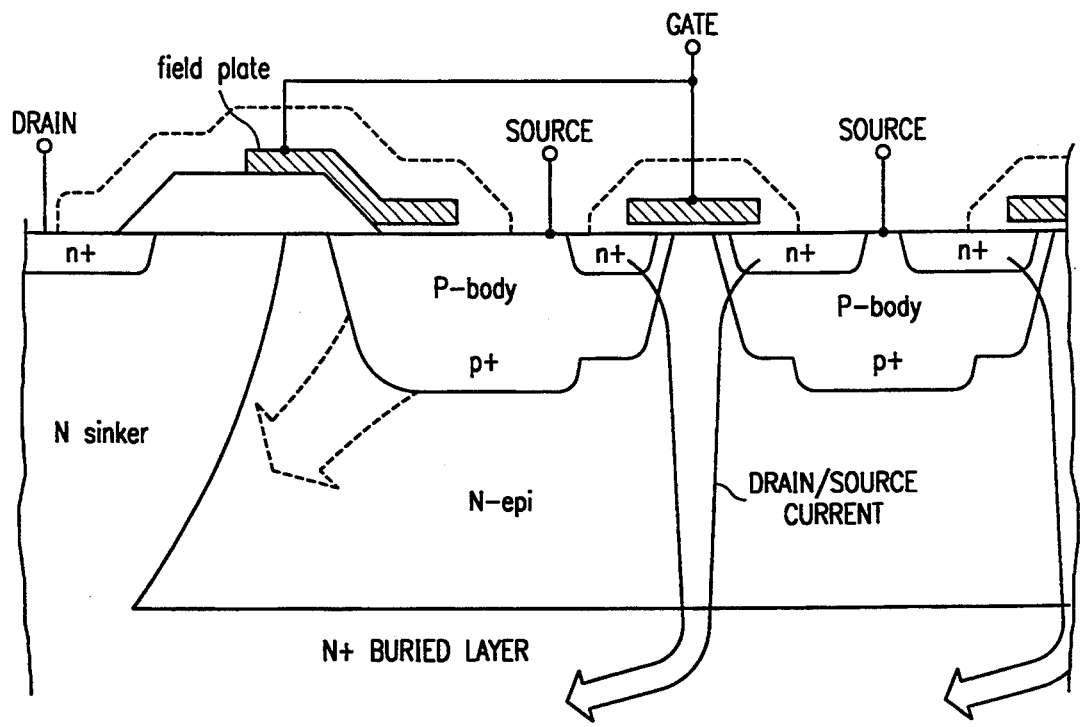
FIG. 5 illustrates a known technique for improving electric field conditions in an edge zone of an integrated VDMOS transistor.
Figure 7:
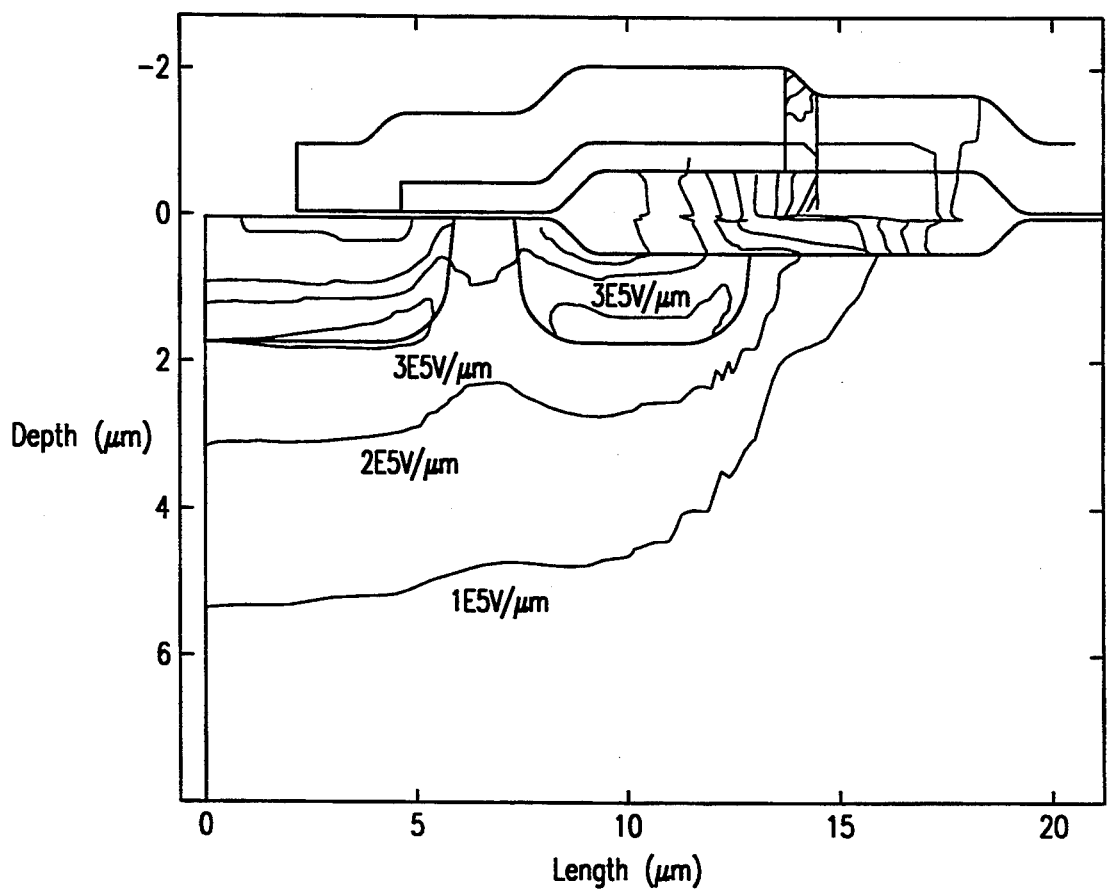
FIG. 7 is a diagram of the electric field contours in an edge zone modified according to the present invention.

The contours of electric field magnitude, as obtained by simulation, in proximity of the critical edge zone of an integrated VDMOS structure provided with a biplanar field-plate and modified according to the present invention, are shown in FIG. 7. As may be easily observed by comparing the electric field contours of FIG. 7 with those of FIG. 4, relative to a comparable edge structure without a field-isolation diffusion connected to the source potential of the transistor, a marked reduction of the intensity of electric field in this critical region for the structure of the invention is evident: In FIG. 4, the highest electric field magnitude shown is approximately $5 \cdot 10^5$ V/cm. (5E5 V/cm); but in FIG. 7, the highest electric field magnitude shown is approximately $3.3 \cdot 10^5$ V/era (3.3E5 V/cm).

Figure 8A:
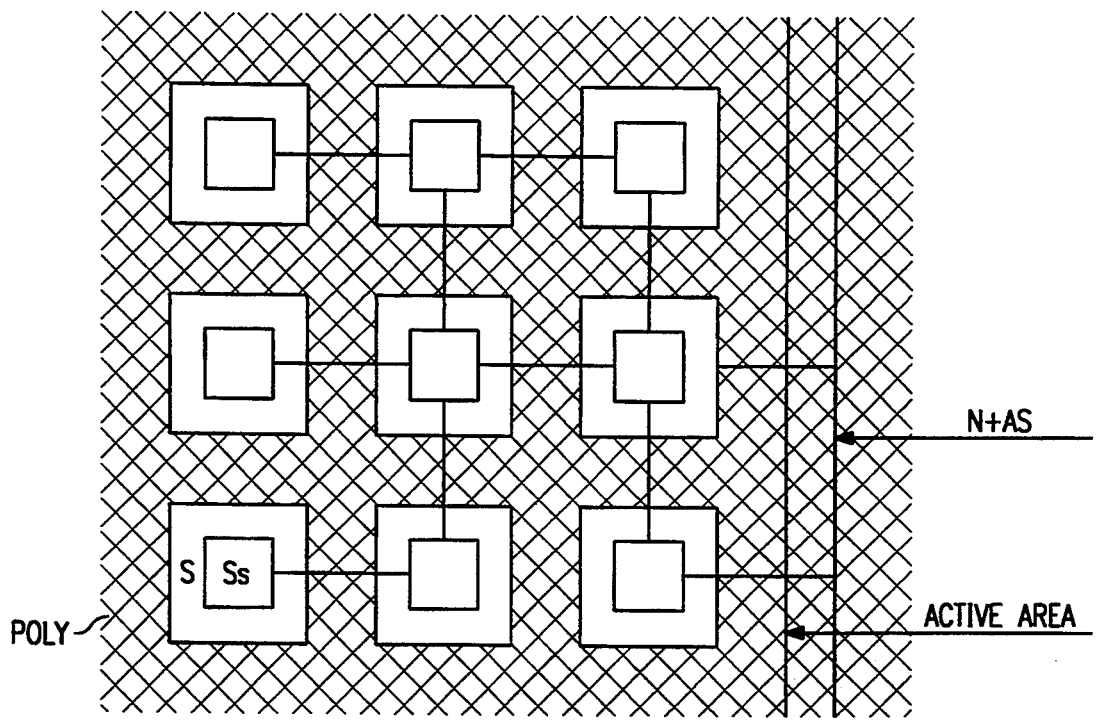
FIG. 8A is a fragmentary, schematic, layout view of an edge portion of an integrated VDMOS transistor, made according to the prior art.
Figure 8B:
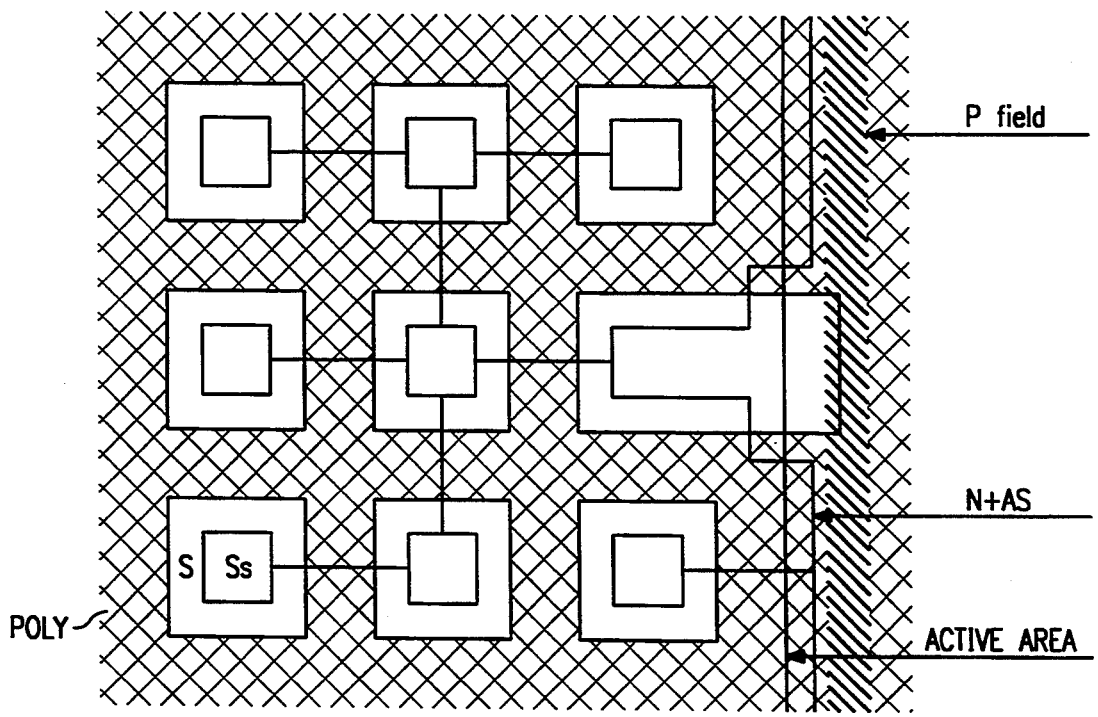
FIG. 8B is a fragmentary, schematic, layout view of an edge portion of an integrated VDMOS transistor, modified according to a preferred embodiment of the present invention.

A very advantageous way of implementing the invention, i.e. of establishing an electrical connection between the source region of the transistor and a field-isolation diffusion formed under the edge portion of the field oxide, is illustrated in the layout of FIG. 8B. For comparison purposes the layout of a similar structure made according to the prior art is reproduced in FIG. 8A.

The two FIGS. 8A and 8B schematically represent a fragment of the layout (i.e. of the profiles of some of the masks used for implanting dopants and for patterning a gate polysilicon layer) of an integrated VDMOS structure. In the two fragmentary plan views of an edge region of the layout of an integrated VDMOS structure, the cross-hatched area, labelled POLY, represents the area that is covered by a patterned conducting layer of doped polycrystalline silicon, constituting a gate structure of the transistor and forming also a biplanar field-plate structure in the portion that overlaps a field oxide layer. The border between the field oxide that separates an active (source) area from a drain diffusion (not shown in the figures) is identified in both FIGS. 8A and 8B by the vertical solid line labelled ACTIVE AREA. The insular areas without shading represent as many source cells of a matrix of cells that may be intermeshed with a drain-connection diffusion eventually formed along the right-hand side of the figures at a certain distance therefrom (not shown in FIGS. 8A and 8B).

The N+ source diffusions (6) are identified by the areas S without cross-hatching. An inner region Ss defined by masking within each source area is implanted with a dopant (e.g. B) for making P+, source-contact, diffusions (8).

The densely hatched vertical strip, labelled P-field, in FIG. 8 represents the area that is implanted with boron for producing a P-field isolation diffusion 5 in proximity of the edge of the field oxide structure According to a preferred embodiment of the invention, the electrical connection between the field-isolation diffusion (P-field 5) and the source region is made by establishing one or more connections between the field-isolation diffusion 5 and the body diffusion of one or more peripheral source cells adjacent thereto, of a matrix of source cells. This may be easily achieved by suitably modifying the mask used for defining the polycrystalline silicon layer (POLY) (i.e. the cross-hatched area) so that for a peripheral source cell every given number of cells the polysilicon layer is backed-off sufficiently to leave essentially exposed a portion of the edge of the field-isolation structure (i.e. the field oxide) as shown in FIG. 8B. In this way, the implantation of the dopant for forming the body region 7 of the device, and the subsequent lateral diffusion of the dopant make the body region 7 extend locally as far as the edge of the field oxide and eventually also underneath the edge of the field oxide (zone 10 of FIG. 6). In this way an intersection between the field-isolation diffusion 5 (P-field) and the local projection 10 of the P-body diffusion is positively established. An electrical connection is thus established between the field-isolation diffusion and the source region of the device.

For example, a connection between a P-field diffusion and the source region of the transistor may be established every eight peripheral source cells of each matrix and this may imply a decrement of the overall channel width corresponding to about 0.5%, i.e. an essentially negligible reduction of the overall channel width of the transistor that in practice has no effect on the internal resistance of the integrated VDMOS transistor.

Of course, similar spaced connections between a field-isolation diffusion and the source region of the transistor may be established along each finger of an inter-digitated, integrated structure of a VDMOS transistor.

The fraction of cells, along the edge of the source matrix, which would typically have their body diffusions extended is normally 1 in 8 or 1 in 10, as presently used, but of course this fraction may be readily varied.

| P-body  | 1.5 to 2 $\mu$m; |
|---------|------------------|
| P-field | 1.5 to 2 $\mu$m; |
| N+      | 0.4 $\mu$m;      |
| P+      | 0.6 $\mu$m.      |

Again, it must be noted that these quantitative data are merely illustrative, and do not delimit the claimed inventions.

Note that the channel-stop diffusion 5, in FIG. 6, is not self-aligned to the field oxide 1. This is normally implemented, in a smart-power process, by using a photomask step after the locos nitride has been etched.

Figure 9:
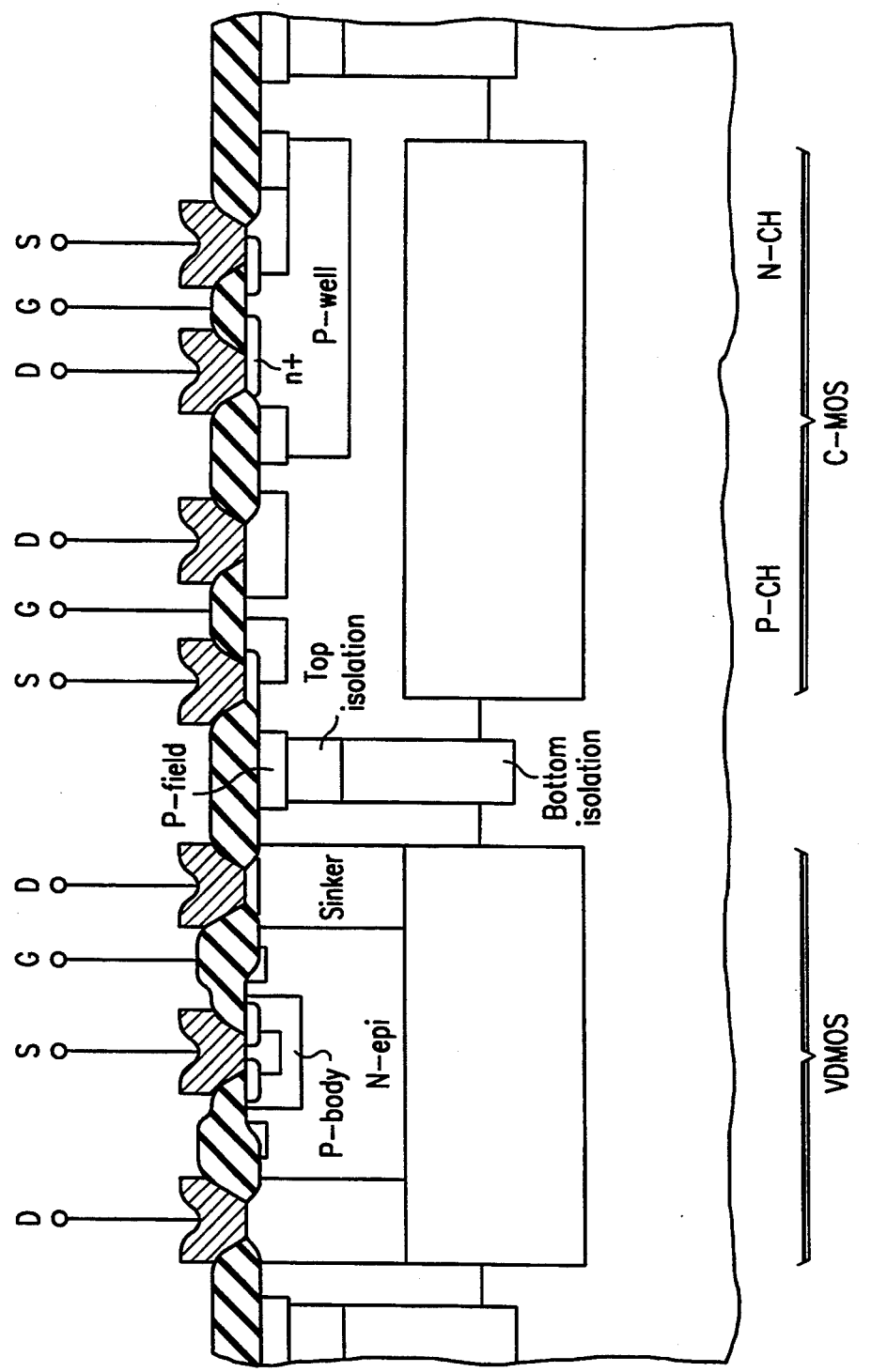
FIG. 9 schematically shows a smart-power integrated circuit structure, in which a VDMOS structure (in which the innovations described above may advantageously be used) is shown side-by-side with a high-density CMOS device from the same chip.

FIG. 9 schematically shows a smart-power integrated circuit structure, in which a VDMOS structure (in which the innovations described above may advantageously be used) is shown side-by-side with a high-density CMOS device from the same chip.

Of course, substantial process integration is used in a smart-power device. The gate of the VDMOS device is preferably provided by the same polysilicon layer which provides the gates of the high-density CMOS devices. However, note that the P-body, P-well, and P-field diffusions are all separate, in the presently preferred embodiment.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A smart-power integrated circuit, comprising:
    a plurality of CMOS devices, including:
        source/drain diffusions of first and second conductivity types;
        one or more well diffusions of a first conductivity type, each enclosing at least two said source/drain diffusions of said second conductivity type;
    one or more power devices, formed in a common substrate with said CMOS devices, and each comprising:
        at least one matrix of source cells, each comprising a source diffusion, a body region substantially enclosing and having a conductivity type opposite to that of said source diffusion, and a gate capacitively coupled to a surface edge of said source diffusion;
        a drain diffusion having the same conductivity type as said source diffusion, and underlying said source and body regions, and being separated therefrom by a drift region having the same conductivity type as said drain diffusion;
        a field-isolation dielectric layer alongside said matrix; and
        a field-plate structure overlying an edge portion of said field-isolation dielectric layer facing peripheral ones of said matrix of source cells;
        a field-isolation diffusion, having the same conductivity type as said body regions, lying under said field-isolation dielectric layer, along the edge thereof facing said peripheral cells;
        wherein said field-isolation diffusion is electrically connected to said body region of at least some ones of said cells of said source matrix.

2. The integrated circuit of claim 1, wherein said field-isolation dielectric consists essentially of silicon dioxide.

3. The integrated circuit of claim 1, wherein said source diffusions of said source cells are N-type.

4. The integrated circuit of claim 1, wherein said field-plate structure consists of an insulated thin-film layer of polycrystalline silicon.

5. A microelectronic power device structure, comprising:
- at least one matrix of source cells at a first surface of a monolithic semiconductor chip, each comprising a source diffusion, a body region substantially enclosing and having a conductivity type which is opposite to that of said source diffusion, and a gate capacitively coupled to a surface edge of said source diffusion;
- a field-isolation dielectric layer alongside said matrix; and
- a field-plate structure overlying an edge portion of said field-isolation dielectric layer facing peripheral ones of said matrix of source cells;
- a field-isolation diffusion, having the same conductivity type as said body regions, lying under said field-isolation dielectric layer, along the edge thereof facing said peripheral cells;
- an electrical connection between said field-isolation diffusion and a source region of the transistor; and
- a drain region, of the same conductivity type as said source region, and electrically connected to a second surface of said monolithic semiconductor chip, opposite said first surface.

6. The device of claim 5, wherein said field-isolation dielectric consists essentially of silicon dioxide.

7. The device of claim 5, wherein said source diffusions of said source cells are N-type.

8. The device of claim 5, wherein said field-plate structure consists of an insulated thin-film layer of polycrystalline silicon.

9. A VDMOS transistor comprising:
- at least one matrix of source cells, each comprising a source diffusion, a body region substantially enclosing and having a conductivity type which is opposite to that of said source diffusion, and a gate capacitively coupled to a surface edge of said source diffusion;
- a drain diffusion having the same conductivity type as said source diffusion, and underlying said source and body regions, and being separated therefrom by a drift region having the same conductivity type as said drain diffusion;
- a field-isolation dielectric layer alongside said matrix; and
- a field-plate structure overlying an edge portion of said field-isolation layer facing peripheral ones of said matrix of source cells;
- a field-isolation diffusion, having the same conductivity type as said body region, lying under said field-isolation dielectric layer, along the edge thereof facing said peripheral cells;
- an electrical connection between said field-isolation diffusion and a source region of the transistor.

10. A VDMOS transistor as defined in claim 9, wherein said electrical connection is constituted by a lateral extension of said body region of at least one of said peripheral cells that intersects said field-isolation diffusion.

11. A VDMOS transistor as defined in claim 9, including a plurality of said matrices of source cells alternated with drain-connection diffusions; said matrices and said drain-connection diffusions being separated by a strip of said dielectric field-isolation layer to form an inter-digitated structure.

12. A VDMOS transistor as defined in claim 9, wherein said source region is n-type, and said body region is P-type, and wherein said body region overlies an N-type epitaxial layer.

13. A VDMOS transistor as defined in claim 12, wherein said P-type body region of at least a peripheral source cell facing the edge of said dielectric field-isolation layer overlying a P-field isolation diffusion, extends as far as intersecting said P-field isolation diffusion for establishing said electrical connection.

14. An integrated VDMOS transistor comprising:
- at least one matrix of source cells, each including a respective source region and a respective body region substantially enclosing and having a conductivity type which is opposite to that of said source diffusion, in a continuous monocrystalline layer;
- a drain-connection diffusion; and
- a first buried layer portion, lying beneath and having the same conductivity type as said source diffusions, and ohmically connected to said drain-connection diffusion;
- a field-isolation diffusion, having a second conductivity type, and lying under a strip of a field-isolation dielectric layer separating said matrix of cells from said drain-connection diffusion; and
- a biplanar field-plate overlaying an edge portion of said field-isolation dielectric layer facing peripheral cells of said matrix,
- and wherein said field-isolation diffusion under said edge portion of the field-isolation dielectric layer, topped by said field-plate, is electrically connected to a source region of the transistor through a projection of a body region of at least one of said peripheral source cells of said matrix extending toward the edge of said field-isolation dielectric layer and intersecting said field-isolation diffusion present under the edge of said field-isolation layer.

15. The integrated circuit of claim 1, wherein said CMOS circuits are electrically interconnected with said power devices.

16. The integrated circuit of claim 1, wherein said drain diffusion is ohmically connected to frontside contacts to provide a drain contact for said power devices.

17. The integrated circuit of claim 1, wherein said source diffusions are located at a first surface of a monolithic semiconductor chip, and said drain diffusion is located at a backside surface of said chip, opposite said first surface.

18. The integrated circuit of claim 1, wherein a first portion of a buried layer, having the same conductivity type as said source diffusions of said power devices, lies beneath said source diffusions of said power devices to provide said drain diffusion, and is ohmically connected to frontside contacts to provide a drain contact for said power devices; and a second portion of said buried layer, which is not continuous with said first portion, lies beneath at least some ones of said well diffusions.

19. The integrated circuit of claim 1, wherein said source region is n-type, and said body region is P-type, and wherein said body region overlies an N-type epitaxial layer.

20. The integrated circuit of claim 1, wherein said electrical connection is constituted by a lateral extension of said body region of at least one of said peripheral cells to intersect said field-isolation diffusion.

21. The device structure of claim 5, wherein said source region is n-type, and said body region is P-type, and wherein said body region overlies an N-type epitaxial layer.

22. The device structure of claim 5, wherein said electrical connection is constituted by a lateral extension of said body region of at least one of said peripheral cells to intersect said field-isolation diffusion.

23. The transistor of claim 14, wherein said field-plate structure consists of an insulated thin-film layer of polycrystalline silicon.

24. The transistor of claim 14, wherein said field-isolation dielectric consists essentially of silicon dioxide.

25. The transistor of claim 14, wherein said source diffusions of said source cells are N-type.

26. The transistor of claim 14, further comprising CMOS circuits located in a common monolithic body and electrically interconnected with said source cells.

* * * * *